(12) United States Patent
Kuriyama

(10) Patent No.: US 7,671,386 B2
(45) Date of Patent: Mar. 2, 2010

(54) SOLID-STATE IMAGING DEVICE, SIGNAL CHARGE DETECTION DEVICE, AND CAMERA

(75) Inventor: Toshihiro Kuriyama, Shiga (JP)

(73) Assignee: Panasonic Corporation, Osaka (JP)

( * ) Notice: Subject to any disclaimer, the term of this patent is extended or adjusted under 35 U.S.C. 154(b) by 338 days.

(21) Appl. No.: 11/617,173

(22) Filed: Dec. 28, 2006

(65) Prior Publication Data
US 2007/0170470 A1   Jul. 26, 2007

(30) Foreign Application Priority Data
Jan. 24, 2006   (JP)   ............... 2006-015572

(51) Int. Cl.
*H01L 27/148*   (2006.01)
(52) U.S. Cl. .............. 257/239; 257/258; 257/443; 257/E27.151
(58) Field of Classification Search ........ 257/257, 257/258, 292, 443, E27.133, E27.151, 239, 257/E27.15, E27.152
See application file for complete search history.

(56) References Cited

U.S. PATENT DOCUMENTS

2004/0141077 A1*   7/2004   Ohkawa ............... 348/308
2004/0173864 A1*   9/2004   Inagaki et al. ............... 257/443
2006/0102827 A1   5/2006   Kasuga et al.
2006/0278948 A1   12/2006   Yamaguchi et al.
2006/0284052 A1   12/2006   Toshikiyo et al.
2007/0035721 A1   2/2007   Toshikiyo et al.

FOREIGN PATENT DOCUMENTS

JP   6-252179   9/1994

OTHER PUBLICATIONS

U.S. Appl. No. 11/569,603 to Murata et al., filed Nov. 27, 2006.
U.S. Appl. No. 11/571,461 to Kasuga et al., filed Dec. 29, 2006.
U.S. Appl. No. 11/621,331 to Onozawa et al., filed Jan. 9, 2007.
English language abstract of JP 06-252179.

* cited by examiner

*Primary Examiner*—Minh-Loan T Tran
*Assistant Examiner*—W. Wendy Kuo
(74) *Attorney, Agent, or Firm*—Greenblum & Bernstein, P.L.C.

(57) ABSTRACT

The solid-state imaging device of the present invention includes: a floating diffusion capacity unit which is formed on a semiconductor substrate, and is operable to hold signal charges derived from incident light; an amplifier which is operable to convert the signal charges held in the floating diffusion capacity unit into a voltage; the first wire which connects the floating diffusion capacity unit to an input of the amplifier; and a second wire which is made of the same material as the first wire, formed in the same layer as the first wire, arranged around the first wire at least along long sides of the first wire, and electrically insulated from the first wire.

11 Claims, 12 Drawing Sheets

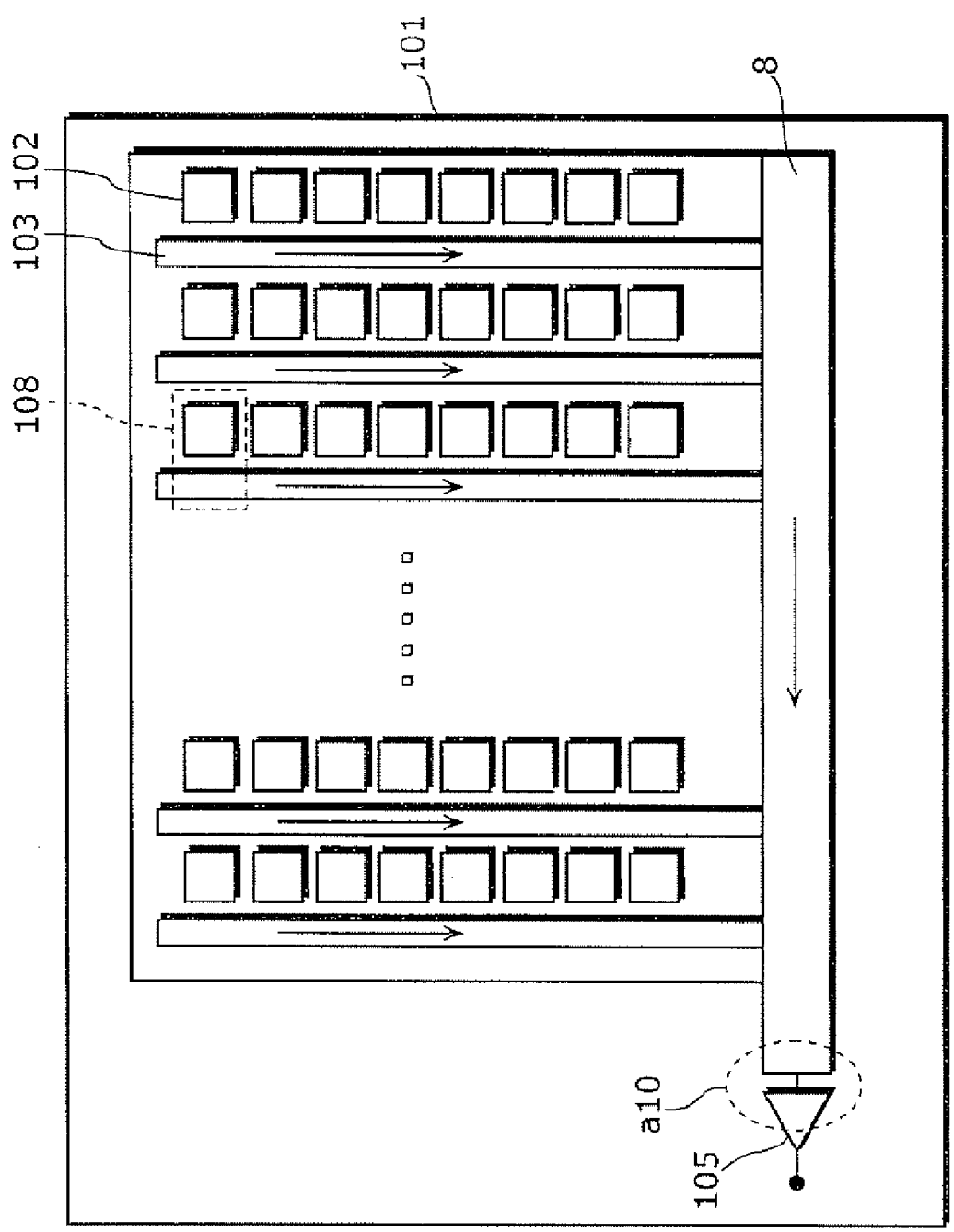

$t \leq S$

SOLID-STATE IMAGING DEVICE, SIGNAL CHARGE DETECTION DEVICE, AND CAMERA

BACKGROUND OF THE INVENTION (1) Field of the Invention

The present invention relates to a solid-state imaging device, and more particularly to a Charge Coupled Device (CCD) solid-state imaging device, a signal charge detection device, and a camera.

(2) Description of the Related Art

In recent years, there has been increasing demand for solid-state imaging devices as imaging devices in digital still cameras, digital video cameras, and the like. Further, portable terminal devices represented by a portable telephone are required to have a camera function, so that the demand for the solid-state imaging device has also been growing for imaging devices in such portable terminal devices. Furthermore, with the aim of realizing high-resolution image, the number of pixels in the solid-state imaging device tends to be increased year by year. Still further, with the requirement for high sensitivity of the digital still cameras, the digital video cameras, the portable terminal devices, and the like, high sensitivity and high signal-to-noise (S/N) ratio of the solid-state imaging device have been also required.

The conventional solid-state imaging device is described herein below with reference to FIGS. 1 to 3. Firstly, a schematic structure of the conventional solid-state imaging device is described. FIG. 1 is a schematic plane view showing a structure of the conventional CCD solid-state imaging device. As shown in FIG. 1, the CCD solid-state imaging device has a semiconductor substrate 101. On the semiconductor substrate 101 are formed: a plurality of light receiving units 102 which are arranged two-dimensionally; vertical transfer units (vertical CCDs) 103 each of which is arranged along each column of the light receiving units 102 in a vertical direction; and a horizontal transfer unit (horizontal CCD) 104 which is arranged adjacent to the final row of the light receiving units 102. Each of the light receiving units 102 is a photodiode for accumulating electric charges (or simply "charges") corresponding to intensity of received light. Note that one light receiving unit 102 and a part of a vertical CCD 103 adjacent to the light receiving unit 102 form one pixel 108.

As shown by arrows of FIG. 1, the charges accumulated in each of the light receiving units 102 are read out and provided to the vertical CCD 103, and transferred in a vertical direction by the vertical CCD 103. The charges transferred by each of the vertical CCDs 103 are transferred in a horizontal direction by the horizontal CCD 104, then amplified by an amplifier 105, and eventually outputted to the outside. This is disclosed in Japanese Patent Application Laid-Open No. 6-252179, for example.

Next, a structure of the amplifier 105 is described in detail with reference to FIG. 2. FIG. 2 is a circuit diagram showing an example of the amplifier unit 105. FIG. 2 shows an amplifier having three-stage source followers. The source follower at the first stage includes a driver transistor Tr1D and a load transistor Tr1L. The driver transistor Tr1D converts the charges transferred by the horizontal CCD 104 into a voltage. The load transistor Tr1L supplies a constant current. The source follower circuits at the second and third stages have the same structure as described for the first-stage source follower, except that an input is a voltage outputted from a prior stage.

Furthermore, the horizontal CCD 104 and the driver transistor Tr1D are described in more detail below.

FIG. 3 is an enlarged plane view showing a part enclosed by a dashed line a1 in the solid-state imaging device of FIG. 1. As shown in FIG. 3, a floating diffusion region 201 of FIG. 3 is a triangle region surrounded by an output gate (OG) 202 and a reset gate (RG) 203 at the end of the horizontal CCD 104. The driver transistor Tr1D of FIG. 2 is a Metal-Oxide-Semiconductor Field-Effect-Transistor (MOSFET) 207. A drain 207a of the driver transistor Tr1D is connected to a power voltage Vdd and a source 207c of the driver transistor Tr1D is connected to the load transistor Tr1L of FIG. 2 which is a load MOSFET and a power source of constant current. The floating diffusion region 201 and the driver transistor Tr1D at the first stage of the amplifier 105 are electrically connected to each other by the first wire 205.

The signal charges in the horizontal CCD 104 are transferred to the floating diffusion region 201 via the output gate 202. Depending on the signal charges transferred to the floating diffusion region 201, an electric potential of the first wire 205 is varied. The amplifier 105 outputs this potential as a voltage. Furthermore, the floating diffusion region 201 drains the signal charges to a reset drain (RD) 204 by a pulse applied to the reset gate 203, so that the signal charges become equivalent to the power voltage.

Moreover, the above-mentioned Japanese Patent Application Laid-Open No. 6-252179 discloses a solid-state imaging device in which a shield wire for electrically shielding the floating diffusion region is arranged between the floating diffusion region and a region which a pulse is applied to and exists at the periphery of the floating diffusion region. Thereby, a coupling capacity of the floating diffusion region and the region which a pulse is applied to and exists at the periphery of the floating diffusion region is reduced, which makes it difficult for the pulse noises to be induced from the periphery to a signal output outputted from the signal charge detection device. As a result, waveform distortion of the above signal output is reduced.

SUMMARY OF THE INVENTION

However, the above conventional technologies have various problems. The first problem is that efficiency of conversion from electric charge to a voltage (hereinafter, referred to also as "charge-to-voltage conversion") is not satisfactory. This is because, after production, an area (length by width) of the wire 205, which connects the floating diffusion region 201 with the amplifier 105, becomes greater than an area defined by a design rule. As a result, a stray capacitance (parasitic capacitance) among the wire 205 and the semiconductor substrate and the like damages the signal charges held in the floating diffusion region 201, which results in reduction of the efficiency of charge-to-voltage conversion.

The second problem is that the S/N rate and the sensitivity of the output voltage are varied. This is because a finished dimension of the above wire 205 has variations. Due to the variations, the output voltage of the amplifier 105 is eventually varied depending on each solid-state imaging device, which causes variations of the S/N rate and the sensitivity.

An object of the present invention is to provide a solid-state imaging device, a signal charge detection device, and a camera, in which the efficiency of charge-to-voltage conversion is increased, and the S/N rate and the sensibility are also increased.

In order to solve the above problems, the solid-state imaging device of the present invention includes: a floating diffusion capacity unit which is formed on a semiconductor substrate, and holds signal charges derived from incident light; an amplifier which converts the signal charges held in the floating diffusion capacity unit into a voltage; a first wire which connects the floating diffusion capacity unit to an input of the amplifier; and a second wire which is so made of the same material as the first wire, formed in the same layer as the first wire, arranged around the first wire at least along long sides of the first wire, and electrically insulated from the first wire.

With the above structure, the second wire is formed as a dummy wire, which makes it possible to improve accuracy of a dimension of the first wire during production, and thereby reduce a stray capacitance of the first wire itself. As a result, without damaging the signal charges in the floating diffusion capacity unit, it is possible to increase efficiency of the charge-to-voltage conversion, thereby increasing the S/N rate and the sensibility. In addition, it is possible to reduce variations in production, thereby increasing and stabilizing efficiency of the conversion from signal charge to a voltage in the amplifier.

Here, the second wire may be arranged to surround the first wire.

With the above structure, it is possible to increase accuracy of the dimension of the first wire in both of a width and a length.

Here, the second wire may be arranged around the first wire but not on a part which is overlapped with at least a part of a reset gate that resets the signal charges in the floating diffusion capacity unit.

With the above structure, it is possible to prevent that a stray capacitance between the reset gate and the second wire affects resetting of the floating diffusion capacity unit.

Here, the solid-state imaging may further includes a plurality of third wires, each of which is made of the same material as the second wire, formed in the same layer as the second wire, arranged around the second wire at least along long sides of the second wire, and electrically insulated from the first wire.

With the above structure, the second wire and a plurality of third wires are formed as double dummy electrodes for the first wire, which makes it possible to further increase accuracy of the dimension of the first wire.

Here, the second wire may be connected to a source of a transistor included in the amplifier.

With the above structure, it is possible to stabilize the second wire to have the same potential of the source.

Here, the first wire may include: a first end connected to the floating diffusion capacity unit via a first contact; a second end connected to the amplifier via a second contact; and a connection wire connecting the first end with the second end and having a width smaller than respective widths of the first end and the second end, and respective distances between (i) the second wire and (ii) the first end, the second end, and the connection wire are equal.

With the above structure, it is possible to minimize the area of the first wire, thereby further increasing the S/N rate and the sensibility.

Here, a distance between the first wire and the second wire may be greater than a distance between the semiconductor substrate and the first wire.

With the above structure, it is possible to eliminate variations of mutual stray capacitances among the first wire, the second wire, and the semiconductor substrate, so that the mutual stray capacitances become appropriate.

Here, a distance between the first wire and the second wire may be 0.5 to 2 times as long as a length of a short side (width) of the first wire.

With the above structure, it is possible to easily achieve accuracy of the dimension of the first wire.

Here, a resin layer may be formed above the first wire and the second wire.

With the above structure, it is possible to increase reliability. Particularly, it is possible to prevent characteristic degradation affected by air humidity.

Further, the signal charge detection device and the camera of the present invention have the same units, operations, and effects as described for the solid-state imaging device.

According to the present invention, it is possible to increase accuracy of the dimension of the first wire which connects the floating diffusion capacity unit (floating diffusion region) with the amplifier, thereby reducing the stray capacitance of the first wire itself. It is thereby possible to increase the efficiency of the charge-to-voltage conversion, eventually increasing the S/N rate and the sensibility. In addition, it is possible to reduce variations in production, thereby increasing and stabilizing efficiency of conversion from signal charge to a voltage in the amplifier.

Further, it is possible to further reduce the area of the first wire, thereby further increasing the S/N rate and the sensibility more. As a result, because of the high sensitivity, it is possible to provide a camera which can capture images of dark sites. Further, variations in the output voltage are reduced, which makes it possible to stabilize efficiency of the camera, increase yield, and reduce a cost.

Furthermore, it is possible to increase reliability, and particularly to prevent characteristic degradation affected by air humidity.

FURTHER INFORMATION ABOUT TECHNICAL BACKGROUND TO THIS APPLICATION

The disclosure of Japanese Patent Application No. 2006-015572 filed on Jan. 24, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate specific embodiments of the present invention. In the Drawings:

FIG. 4 is a schematic plane view showing a structure of a CCD solid-state imaging device according to the present invention;

DESCRIPTION OF THE PREFERRED EMBODIMENT(S)

First Embodiment

The first embodiment is characterized by having: the first wire which connects (i) a floating diffusion region (floating diffusion capacity unit) which is formed at a final stage of a horizontal CCD with (ii) an input of an amplifier which converts signal charges to a voltage; and the second wire which is made of the same material as the first wire, formed in the same layer as the first wire, arranged around all sides of the first wire, and electrically insulated from the first wire. The following describes a solid-state imaging device having the above structure, by which accuracy of a finished dimension of the first wire is increased, and eventually the area (length by width) of the first wire conforms with the design rule and becomes smaller than the area of the corresponding wire in the conventional solid-state imaging device.

Figure 1:
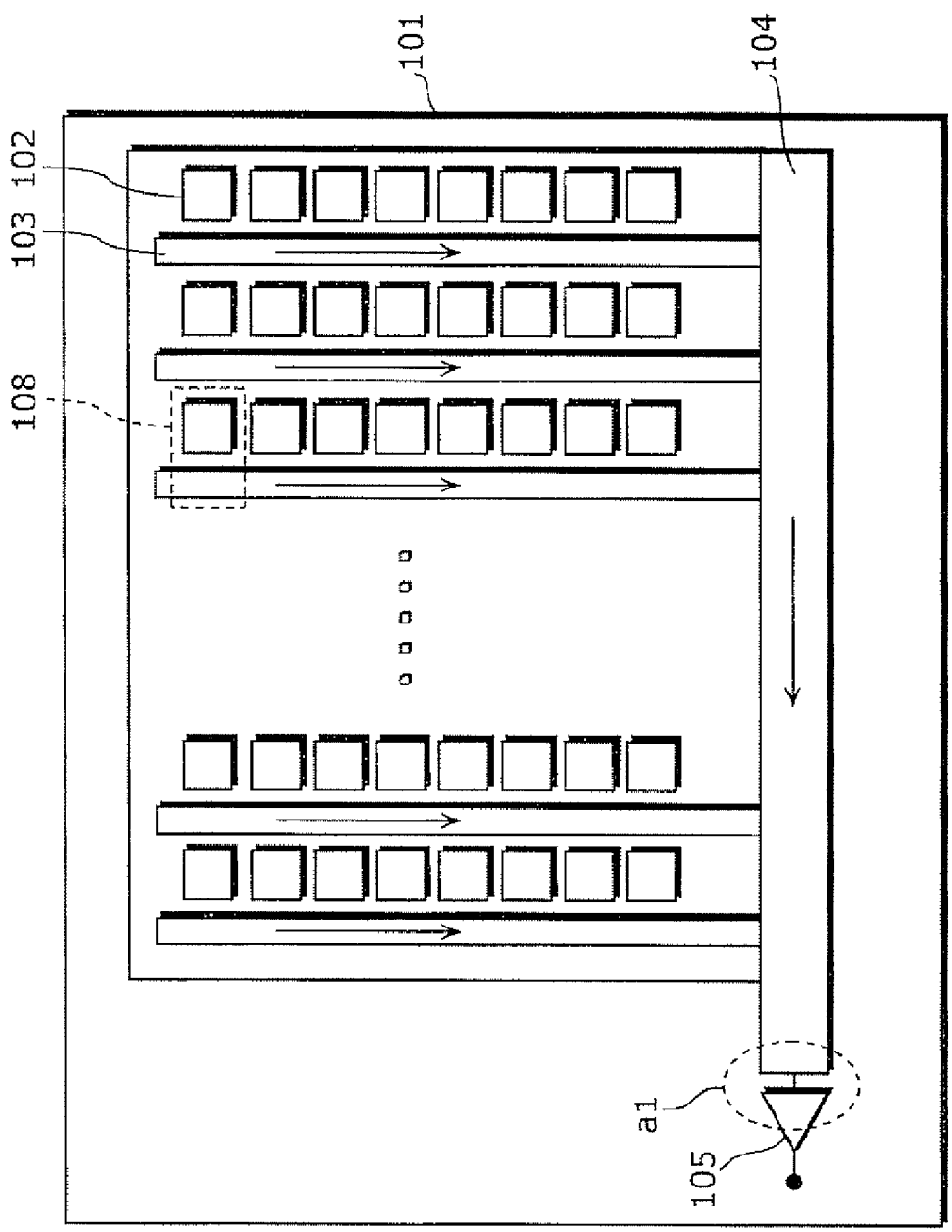
FIG. 1 is a schematic plane view showing a structure of the conventional CCD solid-state imaging device.

The solid-state imaging device according to the first embodiment is described herein below with reference to FIGS. 4 to 7. Firstly, a schematic structure of the solid-state imaging device of the first embodiment is described. FIG. 4 is a schematic plane view showing a structure of the CCD solid-state imaging device according to the present invention. The schematic structure shown in FIG. 4 is basically the same as the structure shown in FIG. 1. As shown again in FIG. 4, the CCD solid-state imaging device has a semiconductor substrate 101. On the semiconductor substrate 101 are formed: a plurality of light receiving units 102 which are arranged two-dimensionally; vertical CCDs 103 each of which is arranged along each column of the light receiving units 102 in a vertical direction; and a horizontal CCD 8 which is arranged adjacent to the final row of the light receiving units 102. Each of the light receiving units 102 is a photodiode for accumulating electric charges corresponding to intensity of received light. Note that one light receiving unit 102 and a part of a vertical CCD 103 adjacent to the light receiving unit 102 form one pixel 108.

As shown by arrows of FIG. 4, the charges accumulated in each of the light receiving units 102 are read out and provided to the vertical CCD 103, and transferred in a vertical direction by the vertical CCD 103. The charges transferred by each of the vertical CCDs 103 are transferred in a horizontal direction by the horizontal CCD 8, then amplified by an amplifier 105, and eventually outputted to the outside.

Figure 2:
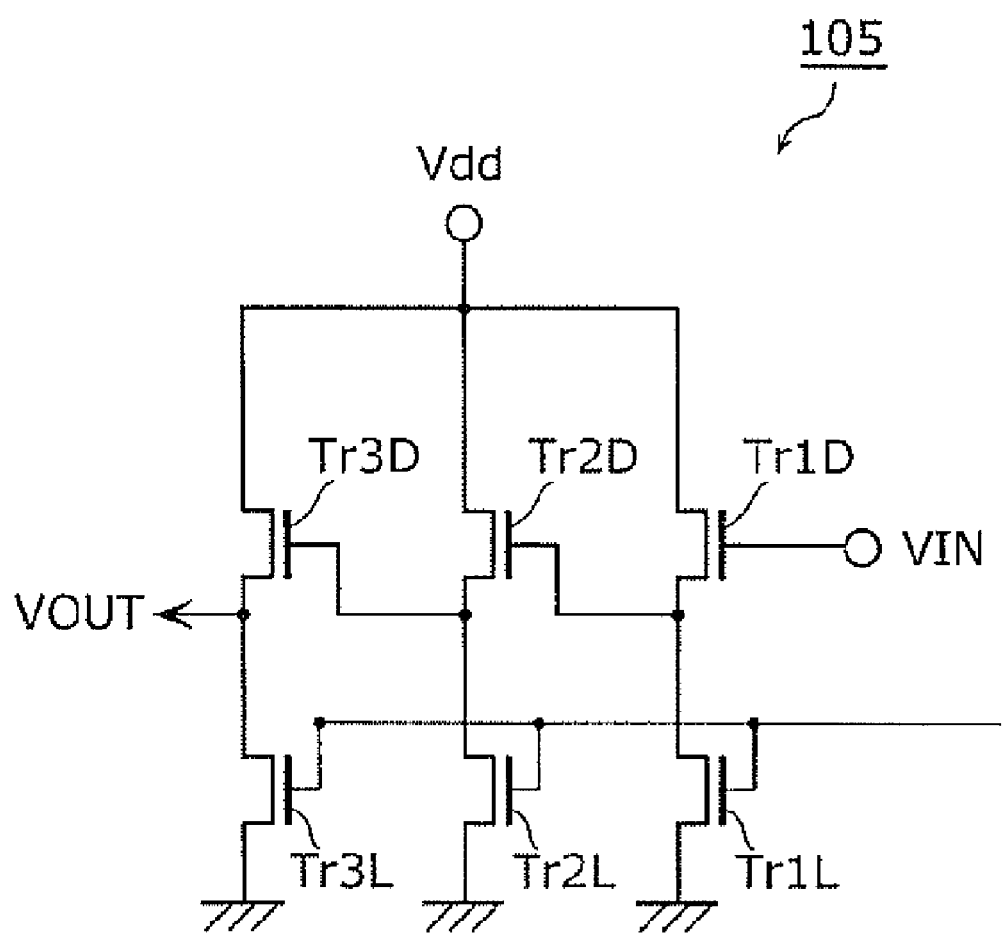
FIG. 2 is a circuit diagram showing an example of an amplifier.
Figure 5A:
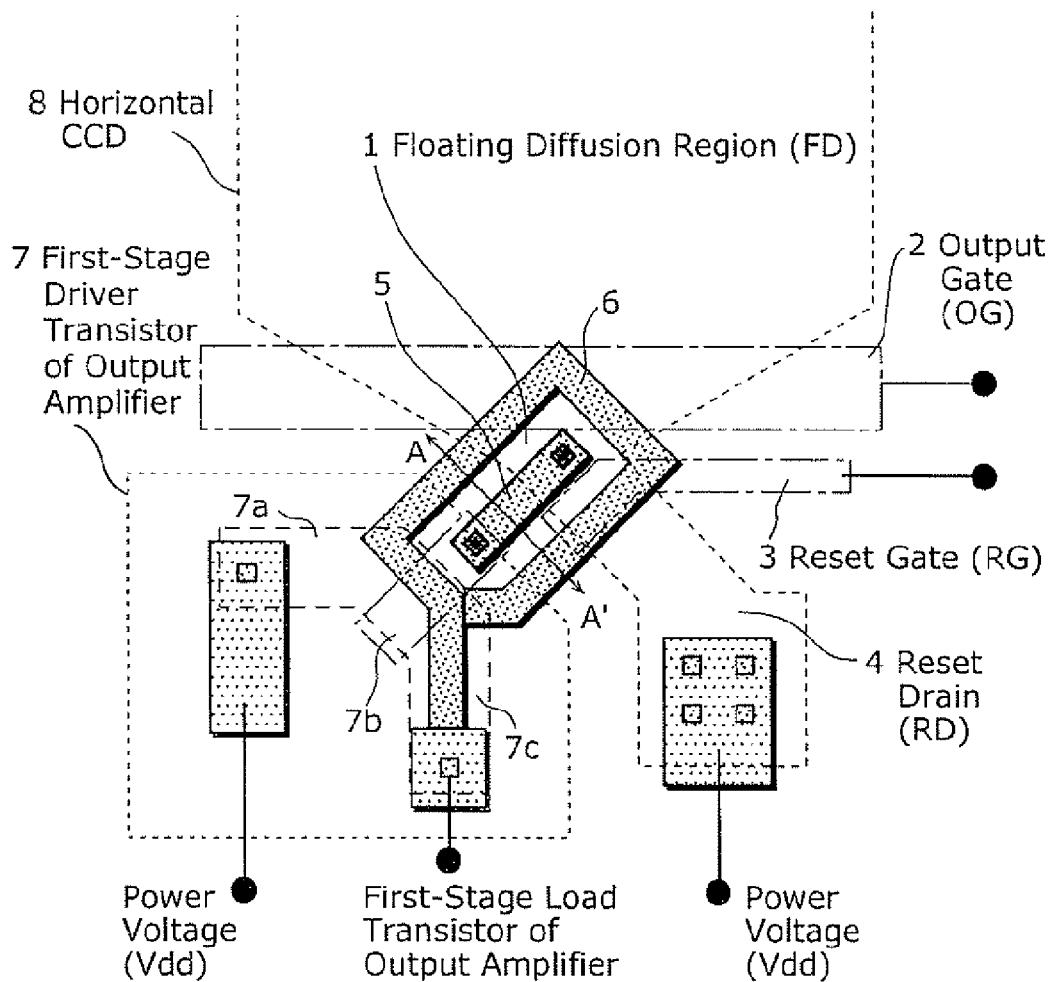
FIG. 5A is an enlarged plane view showing a final stage of a horizontal CCD of a CCD solid-state imaging device according to the first embodiment of the present invention.

Next, a structure of the amplifier 105 according to the first embodiment is described in detail below. The structure of the amplifier 105 of the first embodiment is the same as the conventional structure shown in FIG. 2. As shown in FIG. 2, the amplifier 105 has three-stage source followers. The source follower at the first stage includes a driver transistor Tr1D and a load transistor Tr1L. The driver transistor Tr1D converts the charges transferred by the horizontal CCD 8 into a voltage. The load transistor Tr1L supplies a constant current. An input of the amplifier 105 is a gate of the driver transistor Tr1D. The source follower circuits at the second and third stages have the same structure as described for the first-stage source follower, except that an input is a voltage outputted from a prior stage. FIG. 5A is an enlarged plane view showing a part of the horizontal CCD 8 and the amplifier 105 (shown by a dashed line a10 of FIG. 4) of the CCD solid-state imaging device according to the first embodiment. Note so that this circuit part of the solid-state imaging device of the first embodiment shown in FIG. 5A is a signal charge detection device.

As shown in FIG. 5A, the part of the solid-state imaging device of the first embodiment includes the horizontal CCD 8, a floating diffusion region 1, an output gate (OG) 2, a reset gate (RG) 3, a reset drain (RD) 4, the first wire 5, the second wire 6, and a driver transistor 7. The horizontal CCD 8 transfers the signal charges transferred via the plurality of the vertical CCDs from the plurality of light receiving units. The floating diffusion region 1 is arranged at the end of the horizontal CCD 8 and temporarily holds the signal charges. The output gate 2 outputs the signal charges from the horizontal CCD 8 to the floating diffusion region 1. The reset gate 3 resets a voltage of the floating diffusion region 1 to be a voltage of a power voltage Vdd using a reset pulse. The reset drain 4 is connected to the power voltage Vdd in order to drain the signal charges from the floating diffusion region 1 when resetting a voltage of the floating diffusion region 1. The first wire 5 connects the floating diffusion region 1 to an input of the amplifier 105, in other words, a gate of the driver transistor 7 at the first stage of the amplifier 105. The second wire 6 is made of the same material as the first wire 5, formed in the same layer of the first wire 5, arranged to surround all sides of the first wire 5, and electrically insulated from the first wire 5. The driver transistor 7 is arranged at the first stage of the amplifier 105 which converts the signal charges held in the floating diffusion region 1 to a voltage.

The floating diffusion region 1 is a triangle region surrounded by the output gate 2 and the reset gate 3 at the end of the horizontal CCD 8. This floating diffusion region is formed on the semiconductor substrate. The first-stage driver transistor 7 is a MOSFET corresponding to the driver transistor Tr1D of FIG. 2 according to the first embodiment. Regarding the first-stage driver transistor 7, a drain 7a thereof is connected to the power voltage Vdd, a source 7c thereof is connected to a MOSFET (corresponding to Tr1L of FIG. 2) which is a power source of constant current, and a gate 7b thereof is connected to the first wire 5.

Figure 3:
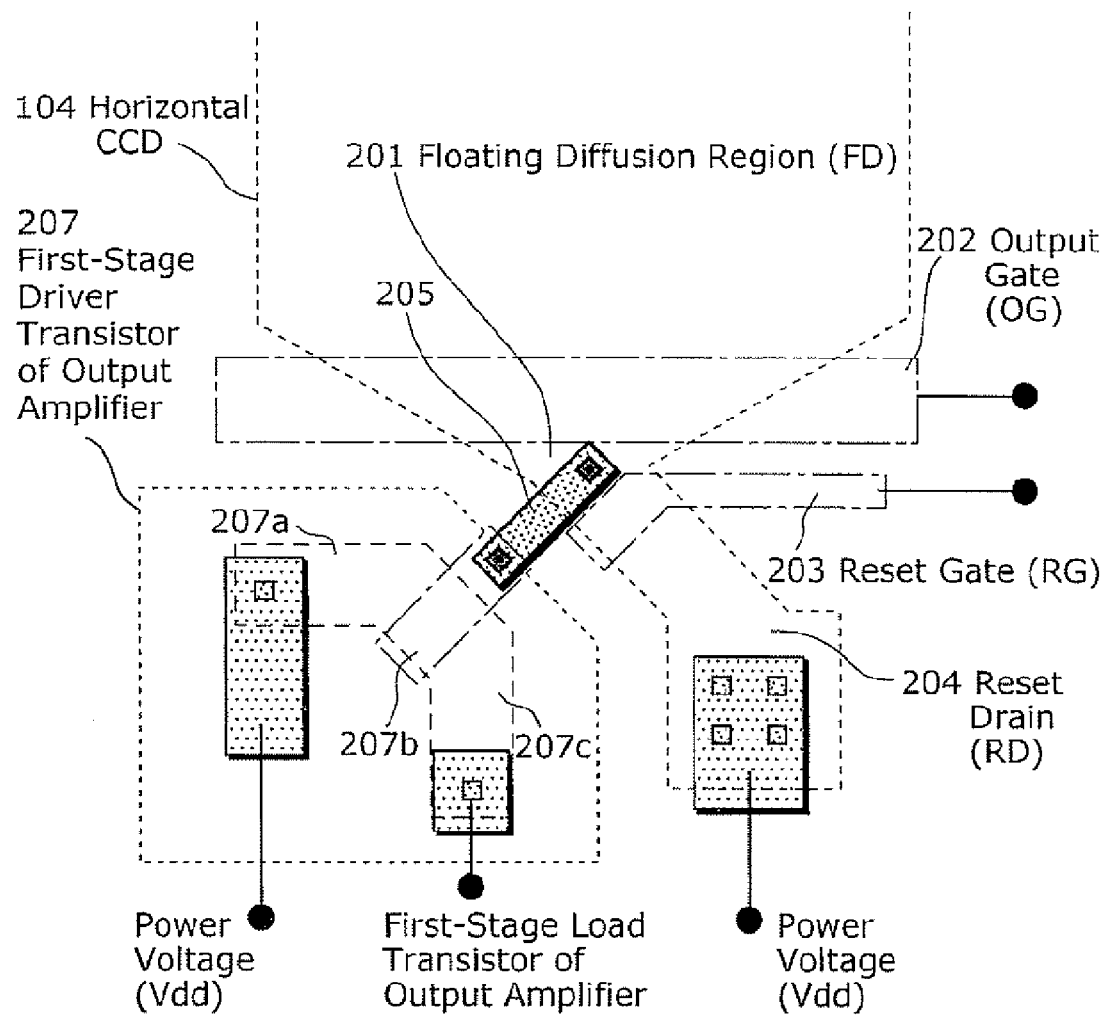
FIG. 3 is an enlarged plan view showing a part of the conventional CCD solid-state imaging device.

As mentioned above, the first wire 5 connects the floating diffusion region 1 to the gate 7b of the driver transistor 7 at the first stage of the amplifier 105, so that a width and a length of the first wire 5, in other words, an area of the first wire 5, becomes smaller than the area of the wire 205 of the conventional solid-state imaging device shown in FIG. 3. In other words, even if the first wire 5 and the conventional wire 205 are produced according to the same design rule and using the same mask of a minimum width, the first wire 5 has a width smaller than a width of the conventional wire 205. This is because the second wire 6 is formed as a dummy wire surrounding the first wire 5.

The second wire 6 is made of the same material as the first wire 51 formed in the same layer of the first wire 5, arranged around all sides of the first wire 5, and electrically insulated from the first wire 5. Moreover, the second wire 6 is connected to the source 7c of the first-stage driver transistor 7.

Figure 6A:
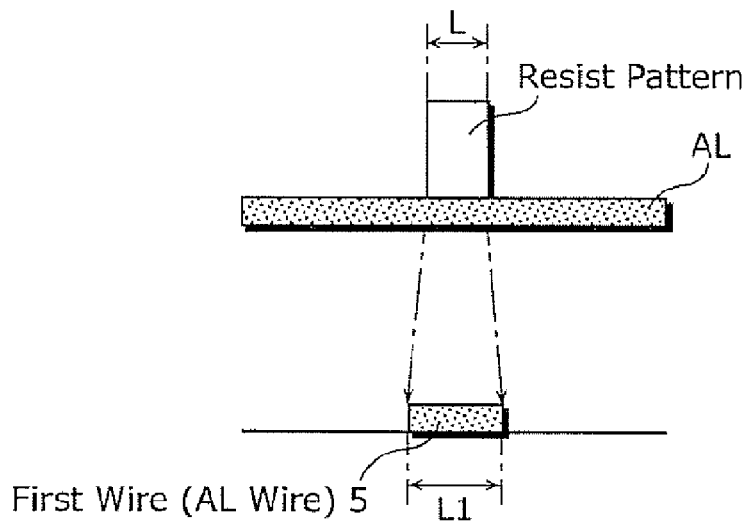
FIG. 6A is an explanatory view showing a finished dimension of an isolated resist pattern.

Next, why the width of the first wire 5 is smaller than the width of the corresponding wire 205 in the conventional solid-state imaging device is explained with reference to FIGS. 6A and 6B. FIG. 6A is a view showing processing of forming of the wire 205 in the conventional solid-state imaging device. As shown in an upper part of FIG. 6A, during the forming of the conventional solid-state imaging device, vapor deposition or the like is applied to the entire surface of the semiconductor substrate to form an aluminum wire layer AL, and a resist pattern for the wire 205 is formed by patterning. This resist pattern is called an isolated resist pattern, since there are no other resist patterns near the resist pattern. A width of this isolated resist pattern is assumed to be L. Next, as shown in a lower part of FIG. 6A, the wire 205 is formed using plasma etching or the like by eliminating the aluminum wire layer AL on which the resist pattern is not formed. As a result, a width L1 of the wire 205 formed in the above manner becomes greater than the width L of the isolated resist pattern.

Figure 5B:
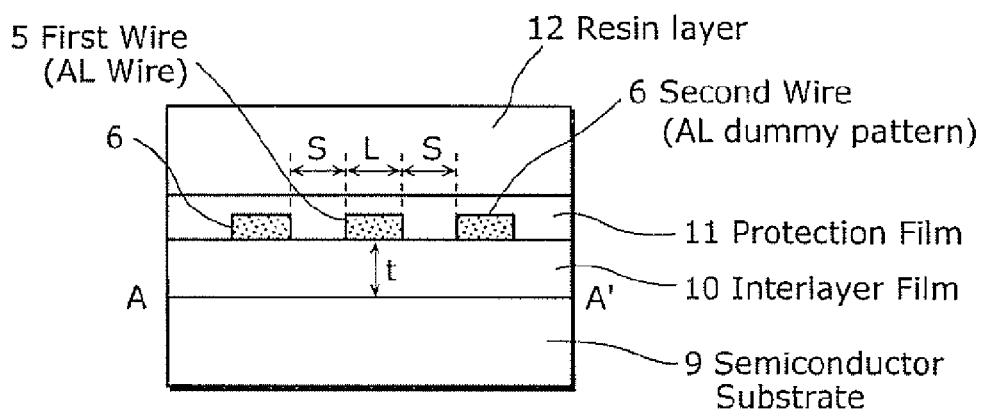
FIG. 5B is a cross-sectional view taken along line A-A' of FIG. 5A.
Figure 6B:
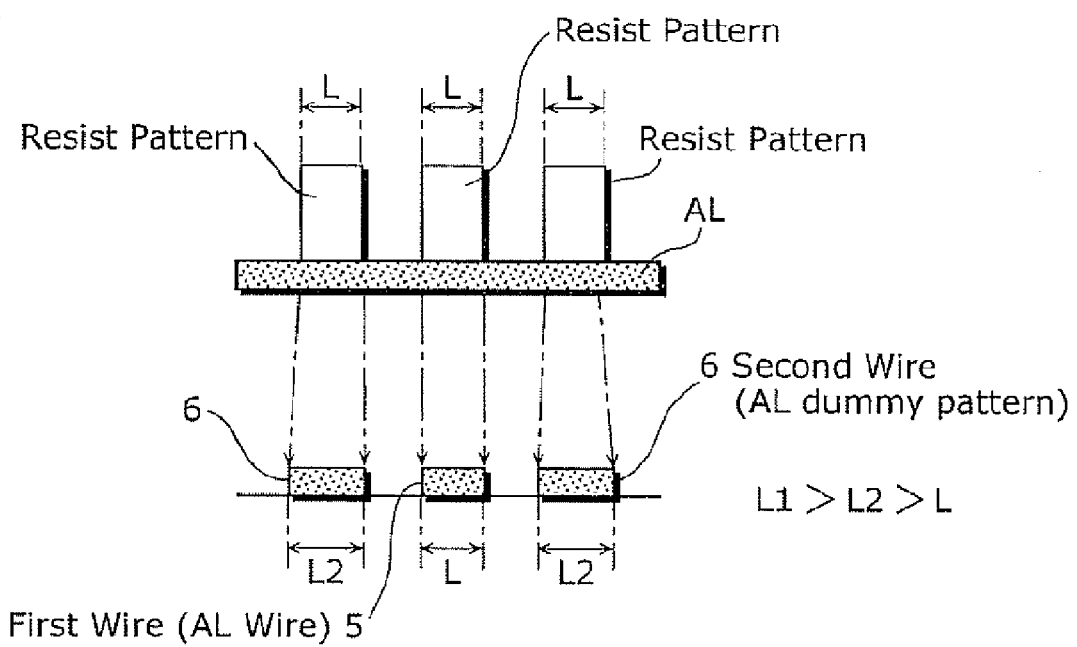
FIG. 6B is an explanatory view showing finished dimensions of crowded resist patterns.

On the other hands, FIG. 6B is a view showing processing of forming of the first wire 5 of the first embodiment of the present invention. As shown in an upper part of FIG. 6B, during the forming of the solid-state imaging device of the first embodiment, vapor deposition or the like is applied to the entire surface of the semiconductor substrate to form an aluminum wire layer AL, and resist patterns for the first wire 5 and the second wire 6 are formed by patterning. These resist patterns are called crowded resist patterns, since there are other resist patterns near the resist pattern. A width of each resist pattern is assumed to be L. Next, as shown in a lower part of FIG. 6B, the first wire 5 and the second wire 6 are formed using plasma etching or the like by eliminating the aluminum wire layer AL on which the resist patterns are not formed. As a result, a width of the first wire 5 becomes almost equivalent to the width L of the resist pattern with satisfactory dimension accuracy, while a width L2 of the second wire 6 becomes grater than the width of the first wire 5, in other words, the width L of the resist pattern (L2>L) and smaller than the width L1 of the conventional wire 205 (L2<L1). As described above, when the crowded resist patterns are used, a width of the wire becomes equal to a width of the resist pattern, while a width of an outmost wire becomes slightly greater than respective widths of the other wires. This is because, during the plasma etching, a material produced during the etching is adhered on a part which is to be a side wall of the aluminum wire, and aluminum in the processing of FIG. 5B is removed from the part more easily than the processing of FIG. 6A, which results in satisfactory plasma etching effects.

Thus, by forming the second wire 6 as a dummy wire to surround the first wire 5, it is possible to increase accuracy of a dimension of the first wire during production, reduce an area of the first wire itself, and reduce a stray capacitance of the first wire.

Next, a cross-sectional view of the first wire 5 and the second wire 6 is described. FIG. 5B is a cross-sectional view taken along line A-A' of FIG. 5A. As shown FIG. 5B, the part of the solid-state imaging device of the first embodiment includes: a semiconductor substrate 9; an interlayer film 10; a protection film 11 having a wire layer including the first wire 5 and the second wire 6; and a resin layer 12, all of which are sequentially stacked from the semiconductor substrate 9. In order to obtain satisfactory accuracy of a width of the first wire 5, a distance S between the first wire 5 and the second wire 6 is set to about 0.5-2 times as long as the width (a length of a short side) L of the first wire 5, and desirably greater than a distance t between the semiconductor substrate 9 and the first wire 5. With such a structure, it is possible to eliminate variations of mutual stray capacitances among the first wire, the second wire, and the semiconductor substrate, so that the mutual stray capacitances become appropriate.

As described above, the first advantages of the solid-state imaging device of the first embodiment are increase of the efficiency of charge-to-voltage conversion. This is because an area of the first wire 5 which connects the floating diffusion region 1 and the input of amplifier 105 is not greater than an area defined by a design rule, and has satisfactory accuracy. As a result, the damage of the signal charges held in the floating diffusion region 201, which is caused by a stray capacitance (parasitic capacitance) between the first wire 5 and the semiconductor substrate and the like, is reduced more than the conventional solid-state imaging device, so that the efficiency of charge-to-voltage conversion is increased.

The second advantages are prevention of variations of the S/N rate and the sensitivity of the output voltage. This is because so a finished dimension of the first wire 5 is not varied, so that it is possible to prevent the output voltage of the amplifier 105 from varying depending on solid-state imaging devices, which results in increase of the S/N rate and the sensitivity.

Note that the second wire 6 is not necessarily connected to the source 7c of the first-stage driver transistor 7.

Figure 7:
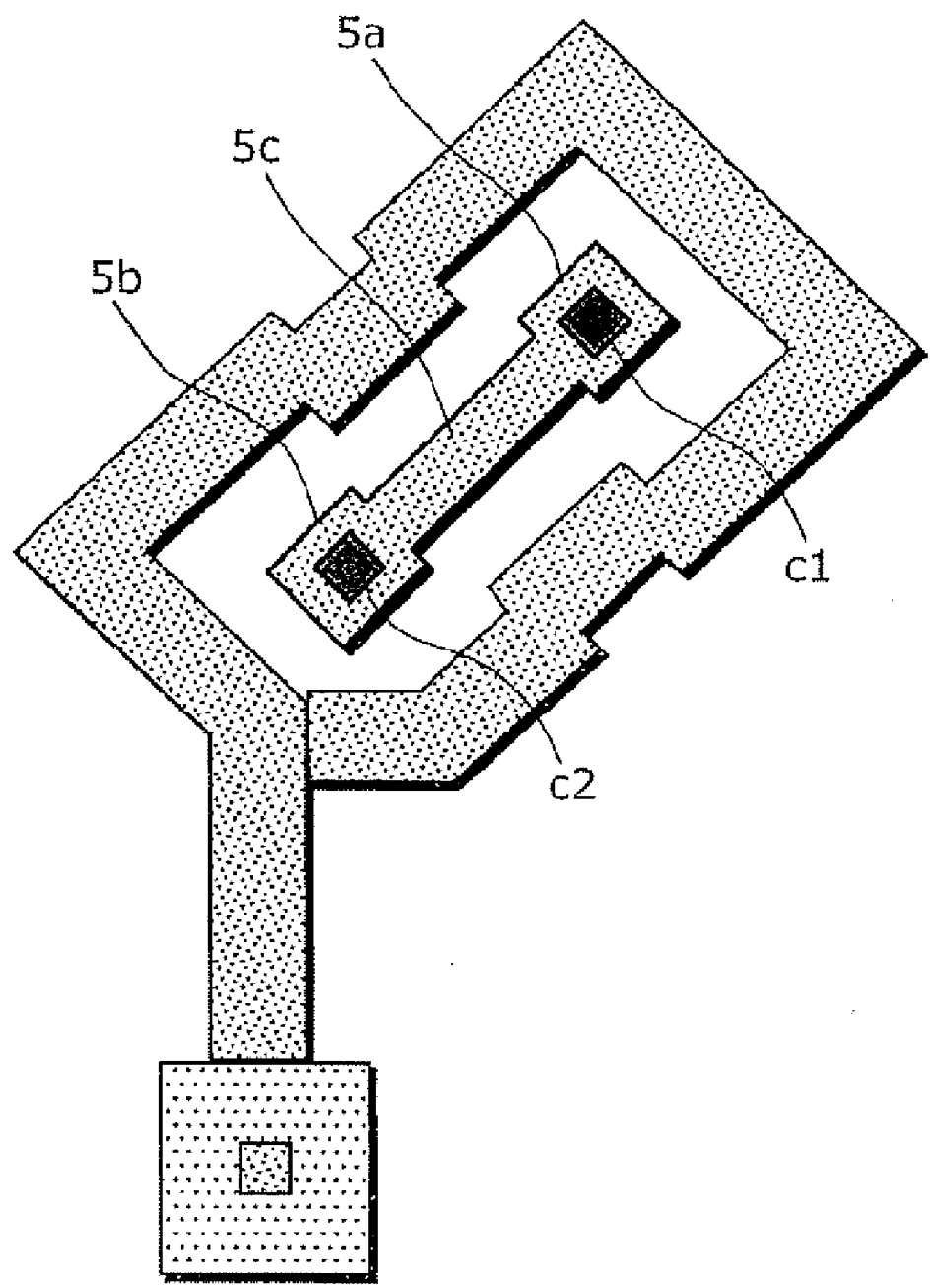
FIG. 7 is a view showing variations of the first wire and the second wire.

Note also that it has been described that the width of the first wire 5 is constant, but the first wire 5 may partly have a smaller width. Here, the part having the small width is not connected to a contact. FIG. 7 shows the first wire and the second wire, when the first wire has such a smaller-width part. As shown in FIG. 7, the first wire has the first end 5a, the second end 5b, and a connection wire 5c. The first end 5a is connected to the floating diffusion region 1 using the first contact c1. The second end 5b is connected to the input of the amplifier 105 using the second contact c2. The connection wire 5c, which has a width smaller than the widths of the first end 5a and the second end 5b, connects the first end 5a with the second end 5b. Respective distances between (i) the second wire and (ii) the first end 5a, the second end 5b, and the connection wire 5c of the first wire are almost equal. With the above structure, it is possible to further reduce the area of the first wire, and thereby further increasing the S/N ratio and the sensitivity.

Note also that the second wire 6 is not necessarily arranged around all sides of the first wire 5 to surround the first wire 5, but may be arranged along at least long sides of the first wire 5.

Second Embodiment

In the first embodiment, the second wire 6 is overlapped with the reset gate 3, which would affect resetting of the floating diffusion region. In order to eliminate such affecting, in the second embodiment which will be described herein, the second wire is arranged around the first wire but not on a part which is overlapped with at least a part of the reset gate 3.

Figure 8:
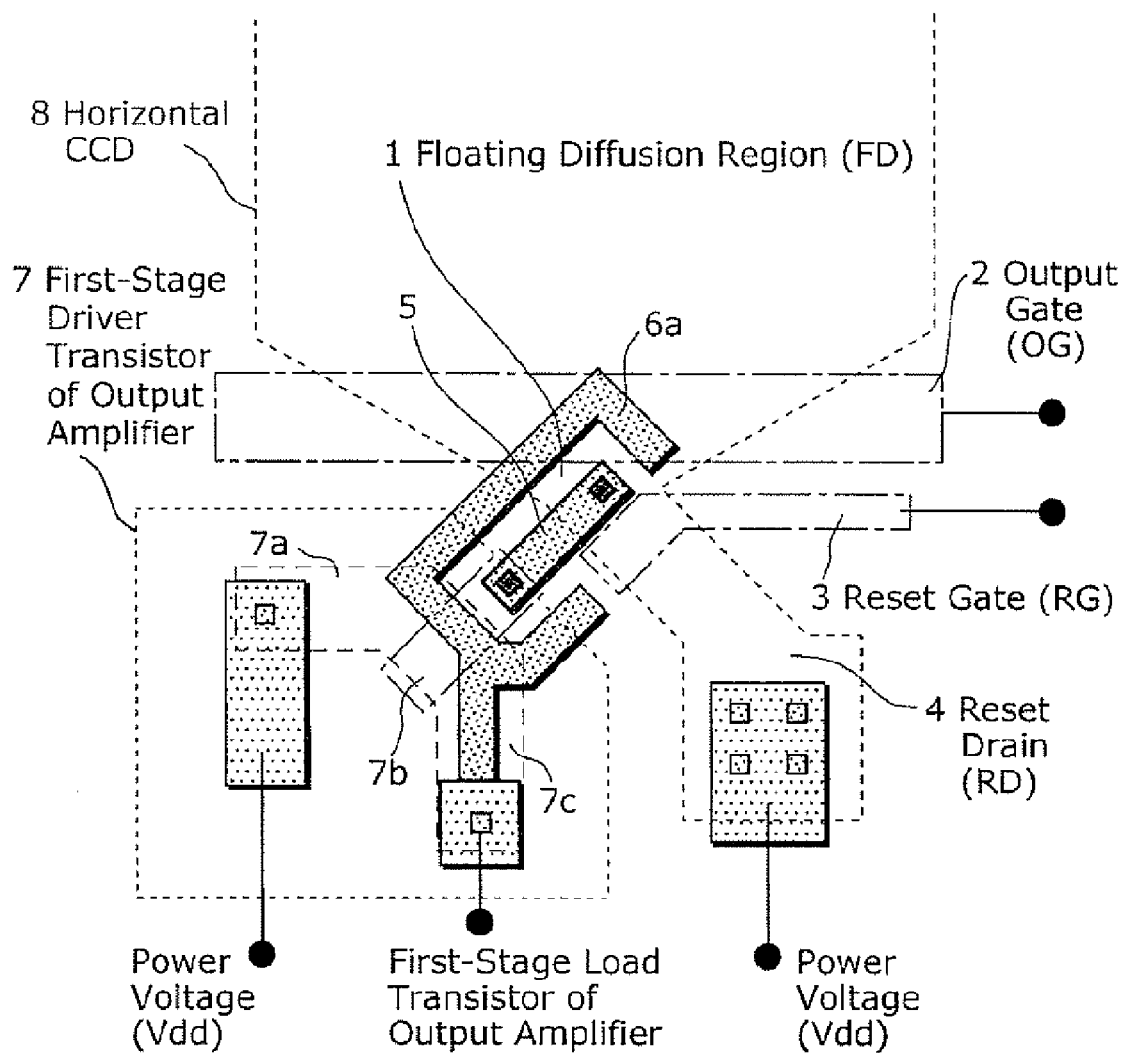
FIG. 8 is an enlarged plane view showing a final stage of a horizontal CCD of a CCD solid-state imaging device according to the second embodiment of the present invention.

FIG. 8 is an enlarged plane view showing a final stage of a horizontal CCD of a CCD solid-state imaging device according to the second embodiment of the present invention. The structure shown in FIG. 8 differs from the structure shown in FIG. 5 in that the second wire 6 is replaced by the second wire 6a. Note that the structure of the second embodiment is the same as the structure of the first embodiment except the above difference, so that the same aspects are not described again and the following mainly describes the difference.

The second wire 6a of FIG. 8 differs from the second wire 6 of FIG. 5 in that the second wire 6a is not formed at an area where the second wire 6 is overlapped with the reset gate 3.

With the above structure, it is possible to prevent that a stray capacitance between the reset gate and the second wire affects resetting of the floating diffusion region 1, in other words, to prevent that the floating diffusion region 1 is completely reset to the power source Vdd.

Note that an electrode of the reset gate 3 may be formed in an upper layer above, a lower layer below, or the same layer as the second wire 6a.

Third Embodiment

In the first embodiment, the width of the second wire 6 is greater than the width of the second wire 5. In the third embodiment, however, a solid-state imaging device is described to increase accuracy of finished dimension of the second wire, thereby further increasing accuracy of finished dimension of the first wire.

Figure 9:
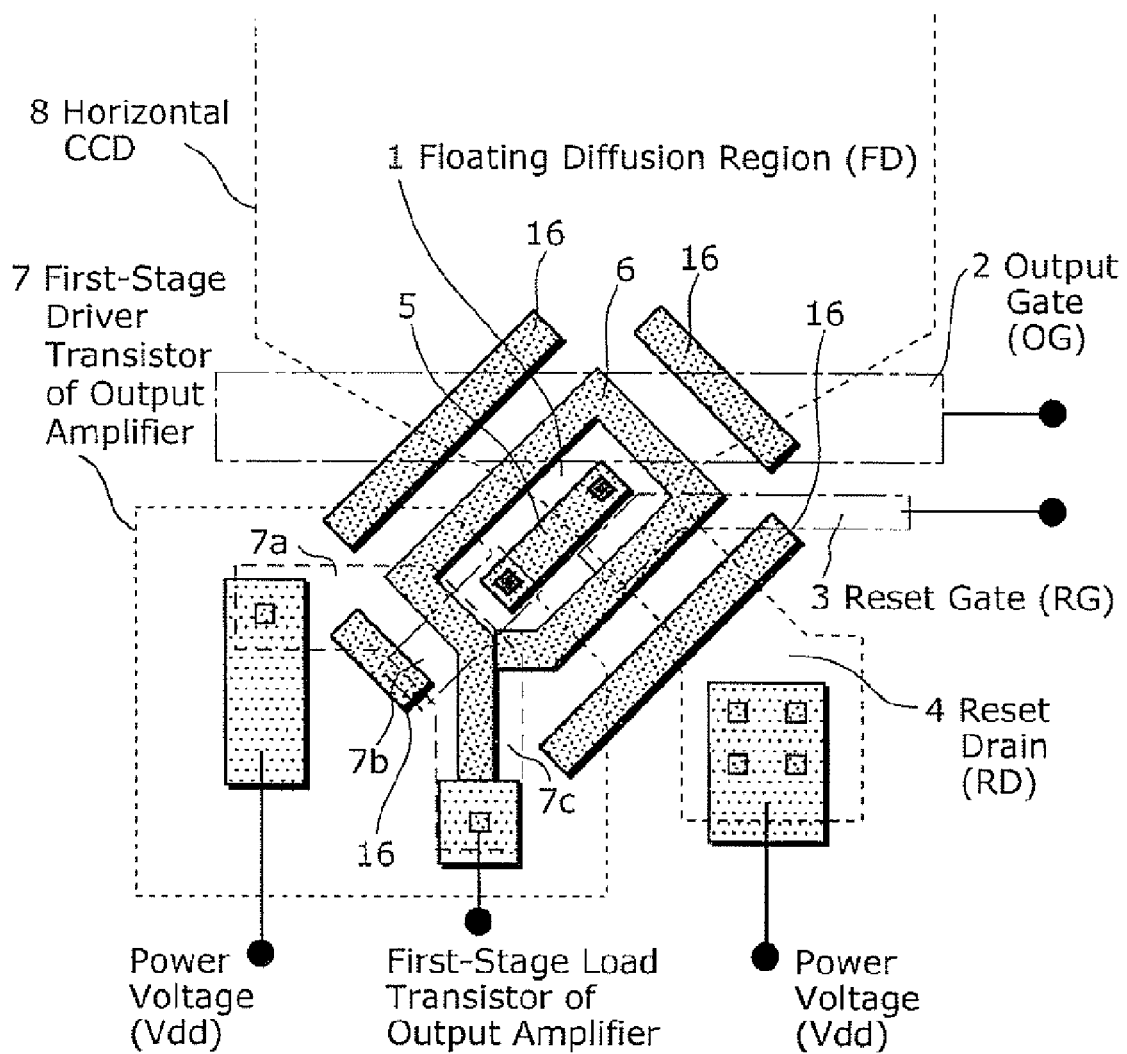
FIG. 9 is an enlarged plane view showing a final stage of a horizontal CCD of a CCD solid-state imaging device according to the third embodiment of the present invention.

FIG. 9 is an enlarged plane view showing a final stage of a horizontal CCD of a CCD solid-state imaging device according to the third embodiment of the present invention. The structure of the FIG. 9 differs from the structure shown in FIG. 5 in that a plurality of the third wires 16 are further added. Note that the structure of the third embodiment is the same as the structure of the first embodiment except the above difference, so that the same aspects are not described again and the following mainly describes the difference.

Each of the third wires 16 is made of the same material as the second wire 6, formed in the same layer as the second wire 6, arranged around the second wire at least along long sides of the second wire 6, and electrically insulated from the first wire 5. In FIG. 9, the third wires 16 are arranged along the four sides of the second wire 6 having a distance S1 from the second wire 6. The distance S1 may be about 0.5-2 times as long as the width L of the first wire 5.

With the above structure, the second wire 6 and the third wires 16 are formed as double dummy electrodes for the first wire 5, so that etching of resist patterns which are more crowded than the resist patterns of FIG. 6B results in further increase of the accuracy of finished dimensions of the second wire 6 as well as the first wire 5.

Note that, in the structure shown in FIG. 9, the second wire 6 may be replaced by the second wire 6a of FIG. 8. Note also that the third wires 16 may be connected with one another. Note also that it is possible to eliminate the wire between the second wire 6 and the source 7c of the first-stage transistor 7, and to arrange the third wires 16 to surround all sides of the second wire 6.

Fourth Embodiment

In the third embodiment, the second wire 6 is connected to the source 7c of the first-stage transistor 7. In the fourth embodiment, however, a solid-state imaging device is described to have the second wire 6 which is not connected to the source 7c of the first-stage transistor 7.

Figure 10:
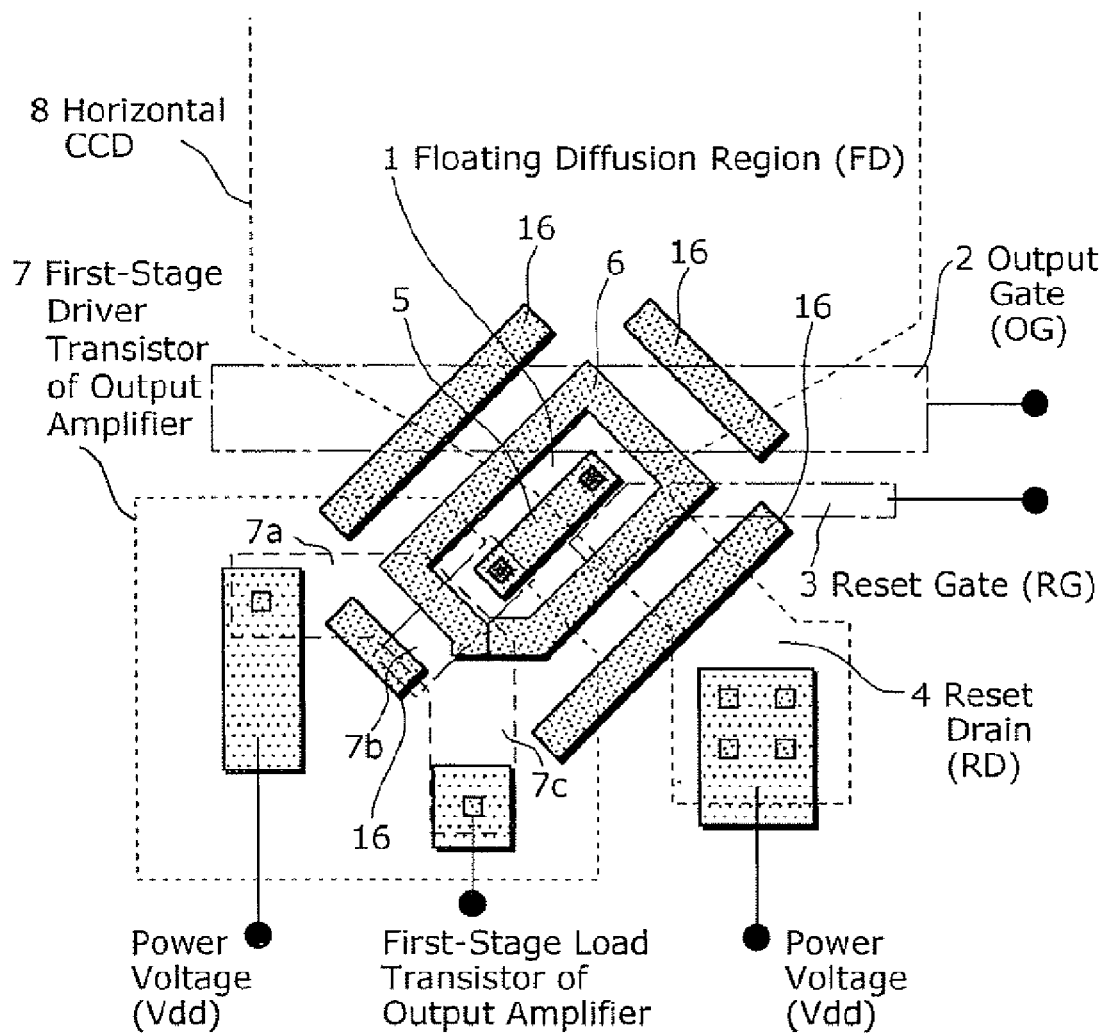
FIG. 10 is an enlarged plane view showing a final stage of a horizontal CCD of a CCD solid-state imaging device according to the fourth embodiment of the present invention.

FIG. 10 is an enlarged plane view showing a final stage of a horizontal CCD of a CCD solid-state imaging device according to the fourth embodiment of the present invention. The structure of the FIG. 10 differs from the structure shown in FIG. 9 in that the wire between the second wire 6 and the source 7c of the first-stage transistor 7 is eliminated. Note that the structure of the fourth embodiment is the same as the structure of the third embodiment except the above difference, so that the same aspects are not described again and the following mainly describes the difference.

In the solid-state imaging device of FIG. 9, the second wire 6 is connected to the source 7c of the first-stage transistor 7, so that a potential of the second wire 6 is varied in synchronization with the source 7c, which prevents pulse-related noises and achieves stability. If noise is injected into the second wire 6, however, there is a possibility that noise is caused in the output voltage of the amplifier 105. Therefore, in the solid-state imaging device of FIG. 10, the wire connecting the second wire 6 with the source 7c of the first-stage transistor 7 is eliminated, so that the second wire 6 is at a floating state.

With the above structure, when the second wire 6 is easily affected by exogenous noises depending on types or the like of the solid-state imaging device, it is possible to reduce the affecting of the noises to the output voltage of the amplifier 105.

Note that, in FIG. 10, the third wires 16 may be connected with one another forming a rectangle, and the second wire 6 may be arranged forming a rectangle. Note also that, also in the second to sixth embodiments, the first wire 5 and the second wire 6 may be formed to have shapes as shown in FIG. 7.

Fifth Embodiment

In the fourth embodiment, the second wire 6 and the third wires 16 are arranged along four sides of the first wire 5. In the fifth embodiment, however, a solid-state imaging device is described to have the second wire 6 which is formed only along long sides of the first wire 5, not along short sides of the first wire 5.

Figure 11:
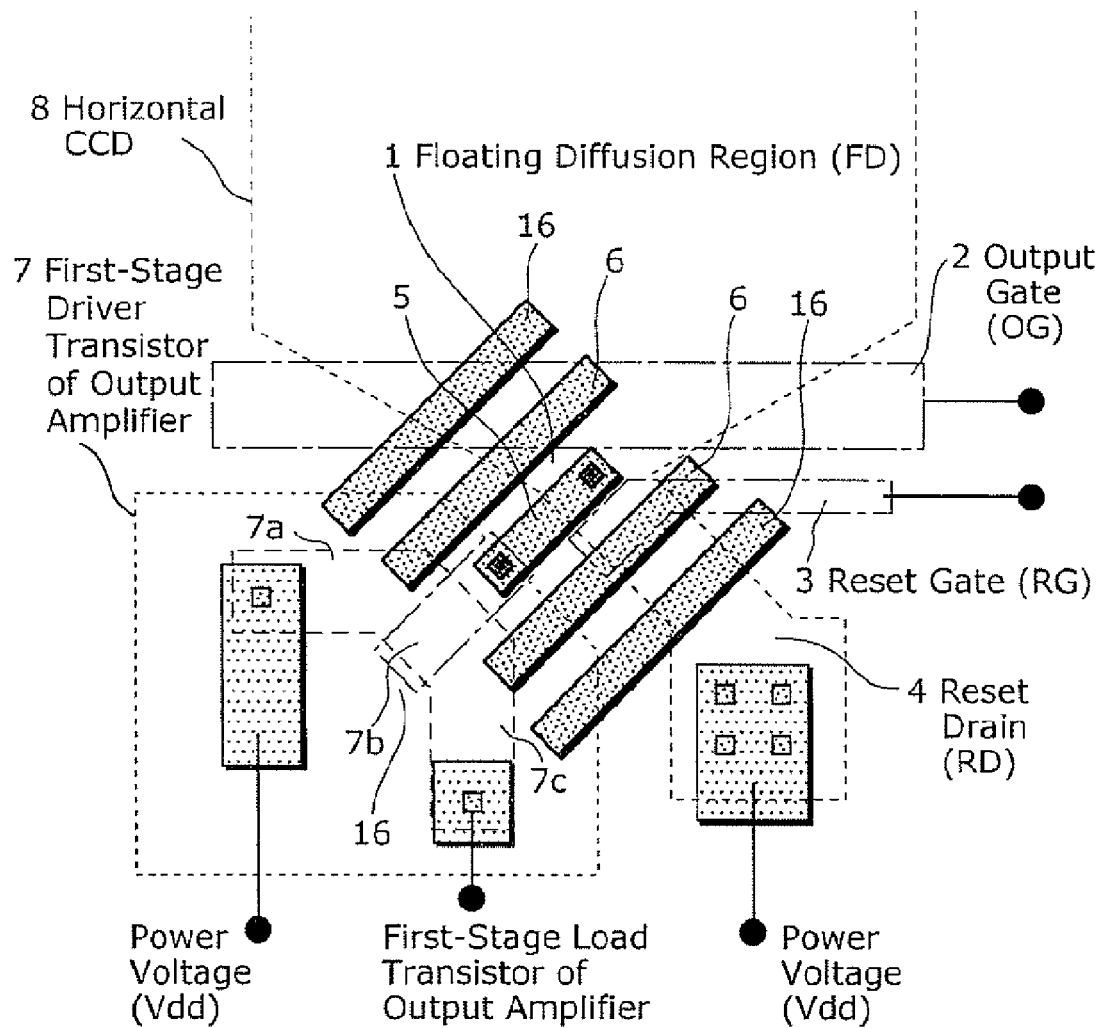
FIG. 11 is an enlarged plane view showing a final stage of a horizontal CCD of a CCD solid-state imaging device according to the fifth embodiment of the present invention.

FIG. 11 is an enlarged plane view showing a final stage of a horizontal CCD of a CCD solid-state imaging device according to the fifth embodiment of the present invention. The structure shown in FIG. 11 differs from the structure shown in FIG. 10 in that parts of the second wire 6, which have been formed along the short sides of the first wire 5, are eliminated, and that parts of the third wires 16, which have been formed along the short sides of the second wire 6, are eliminated. Note that the structure of the fifth embodiment is the same as the structure of the fourth embodiment except the above difference, so that the same aspects are not described again and the following mainly describes the difference.

The second wires 6 are arranged along the long sides of the first wire 5.

The third wires 16 are arranged along the long sides of the second wire 6.

With the above structure, a width of the first wire 6 becomes almost equal to the width L of the resist pattern as described in the above embodiments. Note that, although the accuracy of the finished dimension of the first wire 6 in a length direction is better than the conventional technologies, the accuracy of the fifth embodiment would not be as satisfactory as the accuracy of the above embodiments. Even though the area of the first wire of the fifth embodiment is not smaller than the area of the first wire of the above embodiments, it is possible to reduce the area and achieve the accuracy more than the conventional technologies. Note also that the second and third wires do not exist along the short sides of the first wire 6, which results in easiness of wire designing.

Note also that the second and third wires may be arranged along the short side of the first wire 6.

Sixth Embodiment

In the conventional solid-state imaging devices, on an imaging area where a plurality of the light receiving units are arranged, there is a resin layer (organic film), such as a microlens layer. Here, the resin layer (organic film) is not formed on the area where the wires are arranged. In the sixth embodiment, however, a solid-state imaging device is described to form the resin layer not only on the imaging area, but also on, at least, the signal charge detection device (shown in FIGS. 5 to 8) in the wiring area.

Figure 12A:
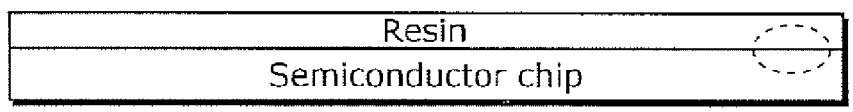
FIGS. 12A to 12C are cross-sectional views of a CCD solid-state imaging device according to the sixth embodiment of the present invention.
Figure 12B:
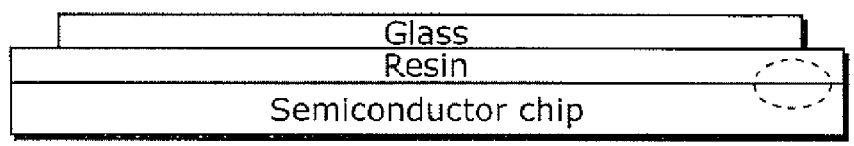
Figure 12C:
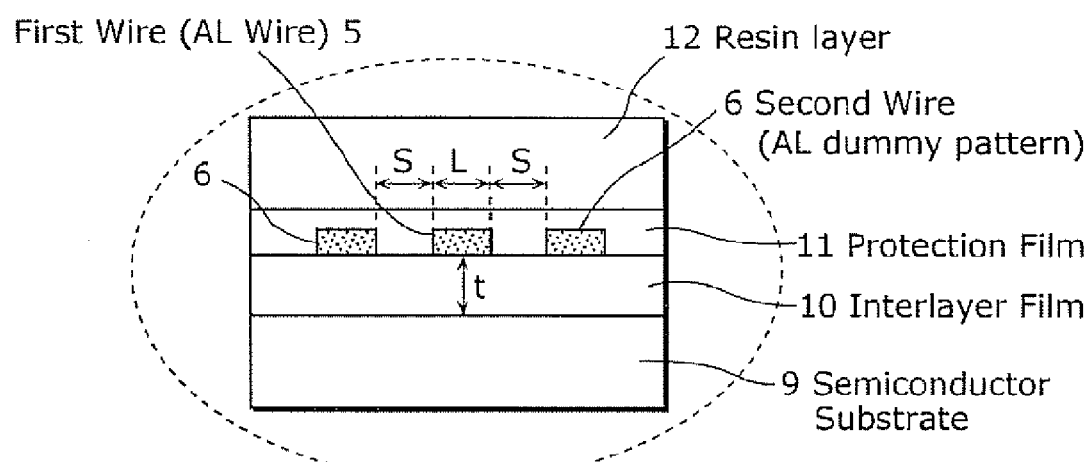

FIGS. 12A to 12C are cross-sectional views of a CCD solid-state imaging device according to the sixth embodiment of the present invention. FIGS. 12A and 12B show cross-sectional views of the whole CCD solid-state imaging device. As shown in FIG. 12A, the solid-state imaging device has a semiconductor chip and a resin layer formed on the semiconductor chip. This resin layer may be made of acrylic material or epoxy material which is the same material as the microlens, and may be formed when the micro-lens is formed. Note also that the resin layer is, of course, not formed on pads. Note also that, as shown in FIG. 12B, the solid-state imaging device has the semiconductor chip, the resin layer formed on the semiconductor chip, and a glass which receives light. This resin layer may be made of acrylic material or epoxy material as described above, and may be a transparent adhesive to stick the glass on the semiconductor chip. FIG. 12C shows an enlarged part enclosed by a dashed line of FIGS. 12A and 12B. The structure shown in FIG. 12C is the same as the previously-described structure shown in FIG. 5B.

With the above structure, although there are disadvantages of increase of the stray capacitance among the resin layer, the first wire 5, and the second wire 6, the disadvantages are acceptable since the area of the first wire 5 is reduced to reduce the stray capacitance in the sixth embodiment. Furthermore, the resin layer is formed on the signal charge detection device, so that it is possible to particularly prevent characteristic degradation affected by air humidity, thereby increasing reliability.

Note also that, also in the second to sixth embodiments, the first wire 5 and the second wire 6 may be formed to have shapes as shown in FIG. 7. Note also that, also in the third to sixth embodiments, the third wires 16 may be formed to have the same shape as the second wire 6 of FIG. 7.

The present invention is suitable as a solid-state imaging device having a plurality of light receiving elements arranged on the semiconductor substrate, a signal charge detection device equipped in the solid-state imaging device, and a camera having the solid-state imaging device. The present invention is suitable as, for example, a CCD image sensor, a MOS image sensor, a digital still camera, a portable telephone having a camera function, a camera embedded in a laptop computer, a camera unit connected to a data processing apparatus, and the like.

Although only some exemplary embodiments of the present invention have been described in detail above, those skilled in the art will be readily appreciate that many modifications are possible in the exemplary embodiments without materially departing from the novel teachings and advantages of the present invention. Accordingly, all such modifications are intended to be included within the scope of this invention.

What is claimed is:

1. A charge-coupled device (CCD) solid-state imager, comprising:
    light receivers, which are arranged two-dimensionally on a semiconductor substrate;
    vertical transferers, each of which is arranged along a corresponding column of said light receivers in a vertical direction;
    a horizontal transferer, which is arranged adjacent to a final row of said light receivers;
    a floating diffusion capacity region, which is formed at an end of said horizontal transferer, and is operable to hold signal charges derived from incident light;
    an amplifier which is operable to convert the signal charges held in said floating diffusion capacity region into a voltage;
    a first wire which connects said floating diffusion capacity region to an input of said amplifier; and
    a second wire which is made of a same material as said first wire, formed in a same layer as said first wire, arranged around said first wire at least along long sides of said first wire, and electrically insulated from said first wire and a power wire.

2. The CCD solid-state imager according to claim 1, wherein said second wire is arranged to surround said first wire.

3. The CCD solid-state imager according to claim 1, wherein said second wire is arranged around said first wire but not on a part which is overlapped with at least a part of a reset gate that resets the signal charges in said floating diffusion capacity region.

4. The CCD solid-state imager according to claim 1, further comprising:
    a plurality of third wires, each of which is made of the same material as said second wire, formed in the same layer as said second wire, arranged around said second wire at least along long sides of said second wire, and electrically insulated from said first wire.

5. The CCD solid-state imager according to claim 1, wherein said second wire is connected to a source of a transistor included in said amplifier.

6. The CCD solid-state imager according to claim 1, wherein said first wire includes:
    a first end connected to said floating diffusion capacity region via a first contact;
    a second end connected to said amplifier via a second contact; and
    a connection wire connecting said first end with said second end and having a width smaller than respective widths of said first end and said second end, and respective distances between (i) said second wire and (ii) said first end, said second end, and said connection wire are equal.

7. The CCD solid-state imager according to claim 1, wherein a distance between said first wire and said second wire is greater than a distance between said semiconductor substrate and said first wire.

8. The CCD solid-state imager according to claim 1, wherein a distance between said first wire and said second wire is 0.5 to 2 times as long as a length of a short side (width) of said first wire.

9. The CCD solid-state imager according to claim 1, wherein a resin layer is formed above said first wire and said second wire.

10. A camera, comprising a charge-coupled device (CCD) solid-state imager,
    wherein said CCD solid-state imager includes:
    light receivers, which are arranged two-dimensionally on a semiconductor substrate;
    vertical transferers, each of which is arranged along a corresponding column of said light receivers in a vertical direction;
    a horizontal transferer, which is arranged adjacent to a final row of said light receivers;
    a floating diffusion capacity region, which is formed at an end of said horizontal transferer, and is operable to hold signal charges derived from incident light;
    an amplifier which is operable to convert the signal charges held in said floating diffusion capacity region into a voltage;

a first wire which connects said floating diffusion capacity region to an input of said amplifier; and a second wire which is made of a same material as said first wire, formed in a same layer as said first wire, arranged around said first wire at least along long sides of said first wire, and electrically insulated from said first wire and a power wire.

11. The camera according to claim 10,
wherein said first wire includes:

a first end connected to said floating diffusion capacity region via a first contact;

a second end connected to said amplifier via a second contact; and a connection wire connecting said first end with said second end and having a width smaller than respective widths of said first end and said second end, and respective distances between (i) said second wire and (ii) said first end, said second end, and said connection wire are equal.

* * * * *